United States Patent [19]

Frohlich et al.

[11] Patent Number: 4,496,420
[45] Date of Patent: Jan. 29, 1985

[54] PROCESS FOR PLASMA DESMEAR ETCHING OF PRINTED CIRCUIT BOARDS AND APPARATUS USED THEREIN

[75] Inventors: Sigurd Frohlich, Santa Barbara; James V. Morris, El Toro, both of Calif.

[73] Assignee: BMC Industries, Inc., Saint Paul, Minn.

[21] Appl. No.: 597,676

[22] Filed: Apr. 6, 1984

[51] Int. Cl.³ ............ B44C 1/22; C03C 15/00; C03C 25/06; B29C 17/08
[52] U.S. Cl. .................... 156/643; 29/852; 134/1; 156/345; 156/644; 156/645; 156/655; 156/272.6; 156/668; 156/902; 204/192 E; 204/298; 427/97; 427/307
[58] Field of Search ............... 134/1; 204/164, 192 E, 204/298; 156/345, 643, 644, 646, 655, 645, 659.1, 668, 272.2, 272.6, 902; 29/852; 427/97, 250, 307; 174/68.5

[56] References Cited

U.S. PATENT DOCUMENTS

| | | | |
|---|---|---|---|
| 4,012,307 | 3/1977 | Phillips | 156/644 X |
| 4,262,186 | 4/1981 | Provancher | 156/643 X |
| 4,277,321 | 7/1981 | Bartlett et al. | 156/644 X |
| 4,289,598 | 9/1981 | Engle | 156/345 X |
| 4,328,081 | 5/1982 | Fazlin | 156/345 X |
| 4,351,697 | 9/1982 | Shanefield et al. | 156/643 |

*Primary Examiner*—William A. Powell
*Attorney, Agent, or Firm*—Leonard Tachner

[57] ABSTRACT

The inconsistent etch-back characteristics of conventional plasma treatment of multilayered printed circuit boards, are overcome by use of a shield, preferably of aluminum, temporarily affixed to each surface of the circuit board during the plasma desmear and etch process. The shield is sufficient size to overlap virtually the entire circuit board and contains an aperture pattern which is substantially congruent with the aperture pattern of the circuit board. The shield affects the plasma process, rendering the etch-back effect substantially homogeneous and consistent throughout the circuit board irrespective of the location of each etched aperture on the circuit board. Alternative embodiments include a wire mesh which obviates the congruent hole pattern requirement and use of a low D.C. bias voltage to further regulate and control the plasma effect.

19 Claims, 10 Drawing Figures

PROCESS FOR PLASMA DESMEAR ETCHING OF PRINTED CIRCUIT BOARDS AND APPARATUS USED THEREIN

BACKGROUND OF THE INVENTION

1. Field of the Invention

The present invention relates primarily to a process and apparatus used in the manufacture of multi-layered printed circuit boards and more specifically, to improvements useful in plasma desmear etching of such boards.

2. Prior Art

Printed circuit board technology is an old and well-known art in the electronics industry. The space saving, low cost and productivity advantages of printed circuit boards for electronic circuitry are well-known benefits enjoyed by virtually all manufacturers of electrical and electronic equipment. As with other areas in electronics technology, the state of the art in printed circuit board design and manufacture has made great strides over the years. As a result, the size of circuit boards has decreased, the density has increased, reliability has improved and productivity has been greatly enhanced. Many of these state of the art improvements in printed circuit board technology relate to the more recent use of multi-layered laminated printed circuit boards.

Although multi-layered printed circuit boards are highly advantageous in that they are capable of providing greatly enhanced circuit density within a given printed circuit board volume, they also present a more complex engineering problem insofar as the manufacture of the board is concerned. For example, the manner of electrically interconnecting the appropriate portions of the circuit layers of the multi-layered printed circuit board is one such complication. This complexity has been readily solved by providing component pin receiving holes that extend through the various layers of the board to provide a means of selectively interconnecting the circuits of the board which are otherwise isolated from one another by intermediate layers of a dielectric material such as an acrylic. Such component pin holes in a multi-layered printed circuit board are very critical to the goal of achieving required performance of the circuit and reliability of the board.

It is very important that the holes comprising the various layers of a multi-layered printed circuit board be of the proper dimension and shape. The metal portions within such holes should be accessible for good contact with the component pin to be installed therein for proper electrical conductivity therebetween without inadvertent insulation as a result of dielectric material. Extraneous dielectric material may result from the circuit board production process and is commonly referred to in the industry as the smear. In the earlier prior art of multi-layered printed circuit board construction, each circuit board layer of the laminated structure was made principally of an epoxy dielectric material. The process of removing the smear from each component hole of the circuit board, a process commonly referred to as desmearing, was readily accomplished by applying appropriate acid such as sulfuric acid to each of the mechanically drilled holes.

This type of acid treatment served a dual purpose. Not only did it remove the smear from the hole but it also performed, to a certain extent, an etching of the intermediate dielectric board layers to measurably increase the diameter of those layers along the inner surface of the hole. As a result, individual annular metalized portions of the respective circuit board layers, which were not affected or affected less by the acid, extended radially into the hole to a greater extent on the order of several thousandths of an inch. Such metalized portions assure a biting metal-to-metal contact between the circuit of each board layer and the metal pin of the component installed into the board holes.

In the more recent prior art of multi-layered printed circuit board manufacture, the substances used for manufacture of the dielectric portion of the multi-layered printed circuit board have been changed to more exotic modern materials such as acrylic, polyimide, Kapton, and Kevlar. These new materials have become particularly advantageous for multi-layered printed circuit board manufacture because they can withstand a more severe environment than epoxy boards. For example, they are far more adapted for use in long term, high temperature applications. Furthermore, many modern packaging requirements particularly for the military and missile applications, and in airborne and satellite applications, require compliance with much more stringent military specifications. The use of higher densities in a multi-layered printed circuit board is often more readily accommodated in flexible structures for easier design and installation within small volumes. In such flexible applications particularly it has been found highly advantageous to use a multi-layer flexible circuit laminated between polyimide glass sections. Twenty layers or more of flex circuitry with board sizes of 24×24 inches or greater can be readily manufactured in such flexible configurations.

Unfortunately, these new exotic materials including polyimide as an example, do not react satisfactorily to acid desmearing and do not become etched to provide the aforementioned advantages derived in using acid on epoxy dielectric materials. Consequently, alternative desmearing and etching techniques have had to be developed.

Fortunately, a new technique has been developed recently which except for a substantial disadvantage to be described hereinafter, provides a viable means for desmearing and etching the holes in multi-layered printed circuits which use the aforementioned modern, more exotic dielectric materials. This recent innovation is commonly referred to as a plasma desmear etcher. In such plasma systems, each circuit board is placed between a pair of parallel plasma plates which are separated from one another by approximately 3 inches and which extend over the entire surface area of the printed circuit board. This is accomplished within an airtight chamber in which the air is evacuated by a pump and replaced with a known mixture of selected gases such as oxygen and freon. A high power radio frequency electric field is then applied to the plates to generate a plasma between the plates. In one typical example the electric field is at a frequency of 4.5 MHz. at a power of 2,200 watts. The plasma around the printed circuit board between the two plates produces a plurality of discharge sparks that occur between the plates and through the predrilled apertures in the printed circuit board. These discharges through the apertures desmear the apertures and etch back the dielectric material despite the use of acrylics and polyimides as well as epoxy resin dielectrics. Thus, the plasma desmear etcher replaces the prior art acid desmearing process and works well with the newer more exotic materials that are resistant to acid desmearing and etching.

However, there is one substantial problem associated with this plasma desmear etcher process which prevents the plasma innovation from being absolutely effective in all respects. This disadvantage relates to the difficulties in controlling the plasma so that the discharge is everywhere consistent and homogeneous along the entire surface of the printed circuit board. The negative effect of this inconsistency is to make the etching of the printed circuit board apertures dependent upon circuit board location. Accordingly, some apertures may be etched beyond the required specifications and some located in a different position on the board may not be adequately etched. Furthermore, in order to assure a minimum level of etching of all apertures irrespective of the aperture location on the board, those portions of the board which receive a more powerful discharge tend to be scorched and over-etched. The inconsistency of plasma desmearing and etching is therefore more likely to reduce the printed board yield during manufacture, increase the cost of manufacture, decrease the possibilities for long term reliability and increase the risk of providing the user with a faulty board.

In military applications where the reliability of the printed circuit board is especially critical, it is common to provide an extra portion of the board for production purposes only. This extra portion or test tab is used as a test vehicle to indicate whether the desmear and etching process during board production has been satisfactory. Such test vehicle portions of the board are typically disposable and are located along the outer perimeter of the board in selected locations. However, when plasma desmear consistency is lacking, even a satisfactorily tested disposable board portion may not provide an accurate indication of the desmeared and etched condition of the board at some portion thereof distant from the test vehicle portion of the board. The present invention is designed to be used with plasma desmear and etching systems to overcome the aforementioned disadvantage with respect to such systems. The applicants know of no other prior art device, system, apparatus or materials which have heretofor been available for overcoming the aforementioned disadvantage.

SUMMARY OF THE INVENTION

The present invention is designed to specifically solve the aforementioned disadvantageous problem associated with plasma desmearing and etching of multi-layered printed circuit boards. More specifically, the present invention comprises an aluminum screen one of which is affixed to one surface of the circuit board and a second of which is affixed to the other surface of the circuit board during plasma processing. Two different embodiments of the inventive screen are disclosed herein. In one such embodiment, the screen consists of an aluminum sheet of approximately the same dimensions as the printed circuit board being subjected to plasma etching and desmearing. The sheet contains a hole pattern which is substantially identical to the hole pattern on the printed circuit board. The circuit board is sandwiched between two such aluminum sheets and the hole patterns of all three are aligned so that the plasma discharge has a clear path from one plasma plate to a second plasma plate through each aperture. In a second embodiment, the aforementioned aluminum sheet is replaced by an aluminum screen that is similar in many respects to a conventional aluminum screen commonly found in use on windows and doorways for preventing insects from entering a structure while permitting air flow to pass through the structure. The difference resides in the size of the aluminum screen mesh and the size of the aluminum wire from which the screen is made. The wire should be thick enough to withstand the effects of the discharge but the mesh size need not be larger than the hole sizes to be desmeared and etched in the printed circuit board. In one actual reduction to practice the mesh size was about 25 thousandths of an inch. Under some circumstances it has been found advantageous to apply a small DC bias voltage to either one of the two of the aforementioned embodiments of the invention by means of a battery or low voltage power supply. With or without the bias, the aluminum screen and the aluminum sheet embodiments of the invention have the highly advantageous and surprising effect of rendering the plasma discharge substantially consistent and homogeneous throughout the surface area of the printed circuit board. As a result, it is now possible for the first time to achieve the highly advantageous desmearing and etching of multi-layered printed circuit boards that use the aforementioned exotic materials that are resistant to conventional acid desmear and etching processes. Furthermore, it is possible now to achieve the aforementioned advantages while avoiding the disadvantageous inconsistent and unequal plasma discharge distribution that otherwise adversely affects the multi-layered printed circuit board which is desmeared and etched in a plasma treatment process. Perhaps most importantly, it is now possible as a result of the present invention to achieve a desmeared and etched multi-layered printed circuit board which meets all of the manufacturer's specifications while precluding the need for potentially dangerous and harmful acid treatment to which conventional circuit boards are subjected.

OBJECTS OF THE INVENTION

It is therefore a principal object of the present invention to provide a novel process and apparatus for more advantageously utilizing plasma desmear and etching apparatus for the manufacture of multi-layered printed circuit boards while avoiding the prior art disadvantageous unequal and inconsistent plasma discharge heretofore described.

It is an additional object of the present invention to provide the novel plasma screen for use with multi-layered printed circuit boards subjected to plasma desmearing and etching which screen has the effect of equalizing and rendering homogeneous the distribution of plasma discharge through the drilled apertures of such printed circuit boards to provide a desmear and etching process of such boards which is more reliable and productive.

It is still a further object of the present invention to provide a novel improvement useful in the process of desmearing and etching multi-layered printed circuit boards using plasma discharge systems wherein the improvement renders the process more likely to provide apertures of consistent etching and desmearing quality while reducing the chances of burning or otherwise damaging certain portions of a printed circuit board.

It is still a further object of the present invention to provide a plasma shield or screen having apertures aligned with a printed circuit board for placement on either side of such a board during the plasma desmearing and etching process which shield or screen may be given a preselected magnitude of DC bias voltage for controlling and equalizing the distribution of plasma discharge therethrough whereby the printed circuit board is properly desmeared and etched.

BRIEF DESCRIPTION OF THE DRAWINGS

The aforementioned objects and advantages of the present invention as well as further objects and advantages thereof will be more fully understood hereinafter as a result of a detailed description of preferred embodiments of the invention when taken in conjunction with the accompanying drawings in which.

DETAILED DESCRIPTION OF PREFERRED EMBODIMENTS

Figure 1:
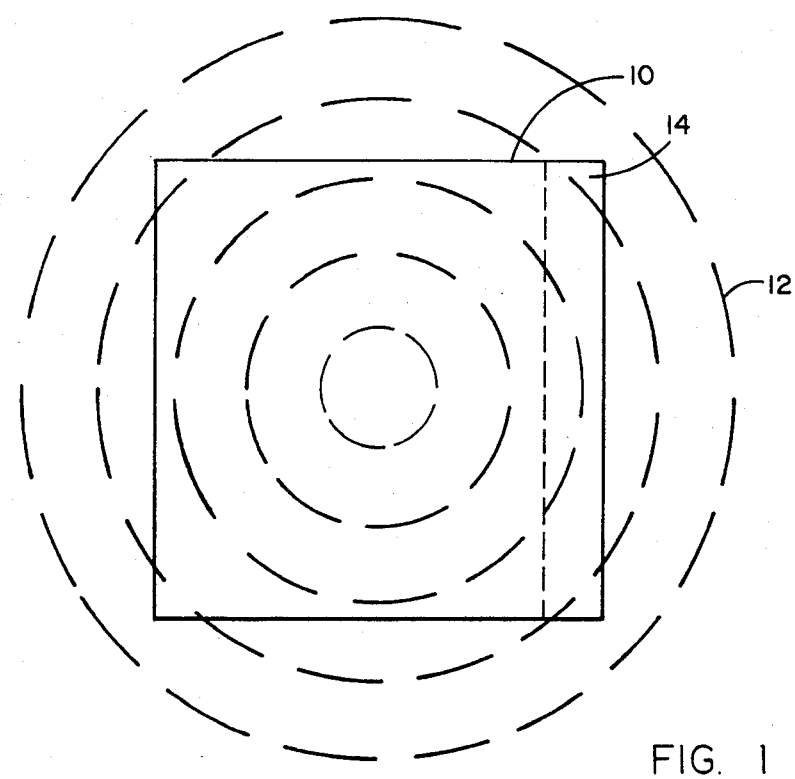
FIG. 1 is a schematic representation of the variation and etching characteristics of prior art plasma desmear etching processes.

The present invention may be best understood by first fully appreciating the problem solved by the invention. Accordingly, reference will first be made to FIGS. 1-4 for a detailed discussion of this problem. As previously indicated, the present invention is designed to solve the problem associated with plasma desmear of multilayered printed circuit boards wherein the extent of the etching process is highly dependent upon the location of the aperture relative to the edge of the board. This is illustrated schematically in simplified form in FIG. 1 where it is shown that, for example, a square printed circuit board 10 may, because of the inconsistent and inhomogeneous distribution of the etching effect, be divided into a plurality of circular regions denoted by the dotted circles 12 of FIG. 1. Typically the radial dimension of these circular or annular regions may be considered to be two inches wherein only within each such circular annulus is the degree of etching of the circuit board relatively consistent. The extent of the etching is greatest in the outer circular regions adjacent the edges of the circuit board. The degree of etching diminishes as the radii of the circular regions is diminished towards the center of the circuit board. Thus, the innermost dotted line circle 12 of FIG. 1 represents an area on the printed circuit board on which the etching process produces the least effect. Of course, it will be understood that the slope of circles 12 of FIG. 1 are dictated by the shape of the circuit board which is substantially square in that figure and that the shape of the diminishing areas of circuit board etching would be dependent upon the board shape. Thus, for example, a more rectangular printed circuit board would exhibit etch-back characteristics which could be more accurately described by representing the areas of diminishing effect by ellipses or other shapes.

The extent of the problem associated with conventional plasma desmear and etching processes is compounded by the difficulty associated with detecting the degree to which the inconsistency of the etching process has effected any specific board during the manufacturing process. Those having skill in the relevant art will appreciate the inherent problems in determining the degree of etching that has been achieved in apertures over the entire board surface. Printed circuit board manufacturers have attempted to provide some means of assuring customers of a satisfactory board manufacturing process by providing a removable and disposable test portion or test tab which may be detached from the completed printed circuit board and carefully examined without concern regarding the destruction of that portion. However, these test portions or test tabs must be located adjacent a board edge in order to avoid destruction of the board. Thus, for example, as seen in FIG. 1, a test portion or test tab 14 is located along a edge of the circuit board 10. Unfortunately, however, because of the location of these test tabs, a careful examination of the etching achieved within the apertures of these tabs does not normally provide a realistic assessment of the etching of all the apertures on the board. In fact as seen in FIG. 1, test tab 14 would not provide an indication of the extent of etching of the central sections of the board that are likely to be the most problematic in respect to the question of whether all of the apertures of the board have been properly etched back to a minimum specification.

Figure 2:
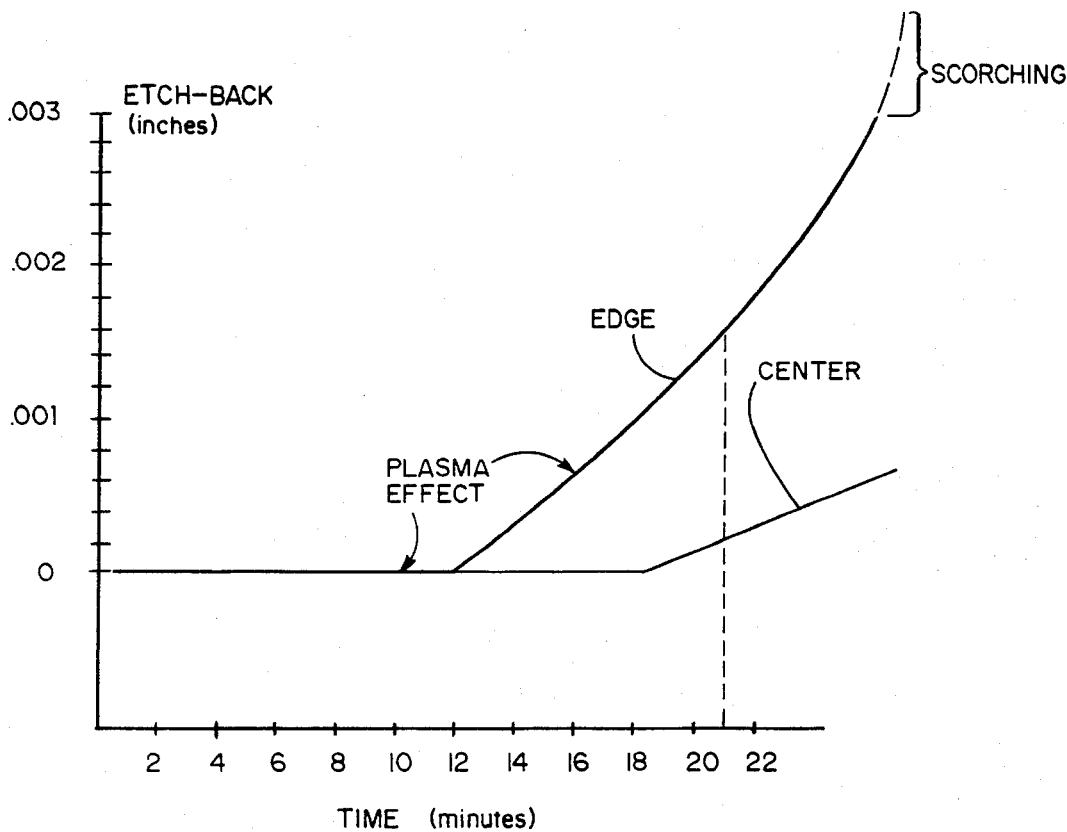
FIG. 2 is a graph illustrating the etch-back characteristics of a plasma desmear apparatus as a function of time for different locations on a printed circuit board.

The problem solved by the present invention may also be better understood by referring to FIG. 2. FIG. 2 is a graphical representation of the etch-back of a typical multilayered printed circuit board resulting from the plasma effect as a function of time for a printed circuit board within a plasma chamber. It is to be understood that FIG. 2 is only representative of a typical plasma desmear and etching process of a typical printed circuit board. Significant variations may be encountered depending upon the board size and number of boards within the chamber, the type of chamber, the power of the plasma inducing electric field and the temperature of the chamber prior to initiation of the plasma process. As seen further in FIG. 2, typically about one half the time devoted to the plasma desmear and etching process does not produce any etch-back effect. After about the first half of the total plasma process time has lapsed, the process begins to take effect and etch-back of the apertures of the printed circuit board starts to occur. As seen in FIG. 2, the etch-back induced by the plasma effect is substantially non-linear with an increasing slope as a function of time. More significantly, as seen in FIG. 2, the etch-back due to the plasma effect is substantially different for an edge portion of the board as compared to the center of the board. Thus, for example, if the plasma process were terminated when the printed circuit board represented by the graph of FIG. 2, would have an etch-back of about 1 mil. within apertures along the edge of the board there would be an etch-back of less than 1/10 mil. within apertures located adjacent the center of the board, and in fact no center etch-back at all until about 21 minutes into the desmear process.

Typically, a uniform specification of minimum etch-back for the entire board is established as a criterion for satisfactory production. One may thus then ask why not simply continue the plasma process for an additional period of time until the etch-back at the center has exceeded this minimum specification? This is in fact the simple solution to which most manufacturers of multi-layered printed circuit boards using conventional plasma desmearing have resorted. Unfortunately, however, this simplified solution does not come without penalty and that penalty is represented in the uppermost right hand corner of FIG. 2 wherein it is shown that eventually scorching occurs along the edge of the circuit board at the elevated levels of etch-back needed to produce the minimum specified etch-back for the center of the circuit board. Scorching is a representative way of describing the eventual damaging attack that the plasma has on the copper surface of the circuit board along its edge and to some extent, inwardly of the edge depending on the degree to which the etch-back requirement at the edges is exceeded in order to achieve the minimum etch-back requirement at the center of the board. In addition to the scorching disadvantage, continued plasma effect brings the etch-back curve into the higher slope portions, particularly for the edge of the circuit board, and makes it far more difficult to control the plasma desmear and etching process. As a result, many boards may be damaged beyond the limits of acceptability and production yields negatively impacted.

Figure 3:
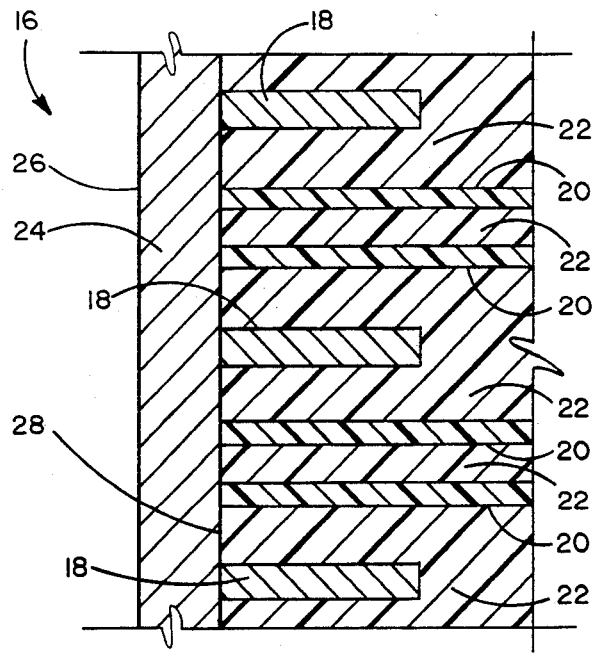
FIG. 3 is a simplified representation of a photomicrograph of a portion of an aperture through a multilayered printed circuit board illustrating the results of an unsatisfactory desmear and etching process.
Figure 4:
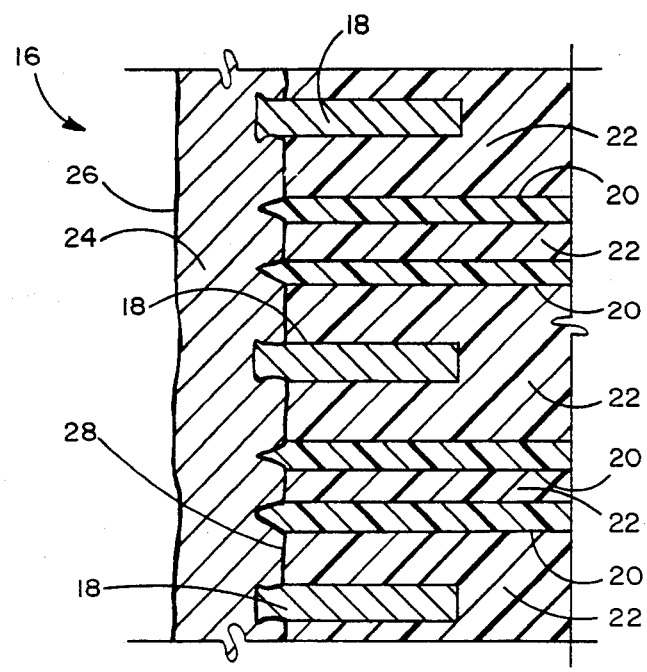
FIG. 4 is a simplified representation of a photomicrograph of a portion of an aperture through a multilayered printed circuit board illustrating the desirable results of a plasma desmear etching process.
Figure 5:
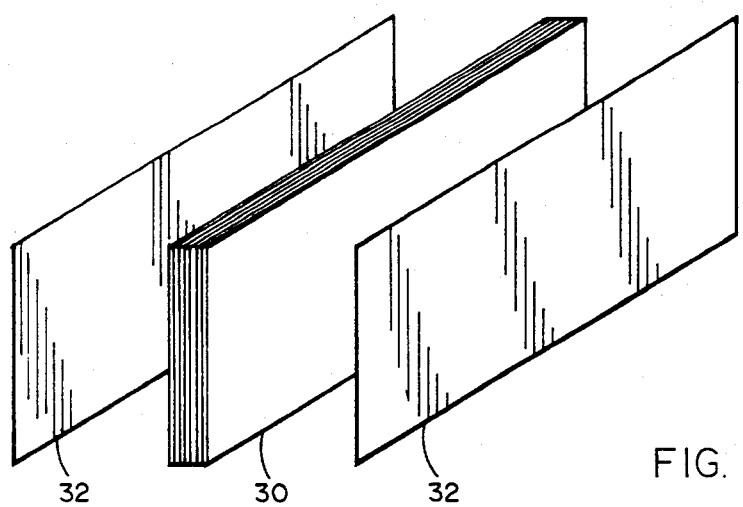
FIG. 5 is a three dimensional view of a multilayered printed circuit board and accompanying pair of plasma shields in accordance with the present invention.

The reason for the concern with the degree of etch-back within the apertures of a multilayered printed circuit board and the basis for specifying a minimum amount of etch-back for all apertures within the printed circuit board, may be more fully appreciated by reference to FIGS. 3 and 4 which are drawings of photomicrographs of portions of the apertures of multilayered printed circuit boards showing unsatisfactory and satisfactory etch-back characteristics, respectively. FIG. 3 illustrates the greatly enlarged cross section of a multi-layered printed circuit board adjacent an aperture 16. Adjacent aperture 16 is a plurality of copper pads 18 among which are interspersed layers of polyimide film 20 and acrylic adhesive 22. The aperture of FIG. 3 has already been plated by a plating 24 which is shown in the left portion of FIG. 3 and which electrically interconnects the copper pads 18. Plating 24 also provides a suitable metalized receiving surface for the pin of a component to be installed on the circuit board. FIG. 3 is most noteworthy for illustrating the geometrical characteristics of the plating 24, primarily from the standpoint of the shape of its left and right surfaces 26 and 28, respectively. More specifically, as seen in FIG. 3, the left surface 26 of the plating 24 is relatively straight and the right surface 28 of the plating 24 is relatively smooth. The smooth surface 28 of the plating is indicative of little or no etching of the acrylic adhesive 22 and the polyimide film layer 20. As a result, the principal interconnection between the plating 24 and the copper pads 18 is along just the one vertical surface therebetween. Consequently, the electrical contact between the pads and the plating is extremely tenuous at best and may not provide a reliable electrical interconnection between board layers. Furthermore, because of the smooth surface 26 of the plating 24, the interconnection between the component pin that is inserted into aperture 16 and the electrical pads connected in the respective layers around aperture 16, is also tenuous at best. Those having skill in the art to which the present invention pertains will appreciate that the smooth surface 26 of plating 24 is due substantially to the lack of etch-back of the aperture prior to plating.

In contrast to the unsatisfactory, inadequately etched aperture configuration of FIG. 3, a properly etched and plated aperture is seen clearly in FIG. 4. As shown in FIG. 4, there is a considerable amount of etch-back of both the acrylic adhesive layers 22 as well as the polyimide film layers 20. As a result, the right surface 28 of the plating 24 has filled in the etched areas and contacts the copper pads 18 along three surfaces, thereby assuring excellent electrical interconnection between the various pads 18. It will also be seen that as a result of the etching of the acrylic adhesive and the polyimide film layers, the left surface 26 of plating 24 varies considerably from a straight line. Consequently, the frictional engagement between the aperture 16 and a pin of a component installed in the aperture is likely to be significantly greater and far more secure thereby assuring excellent electrical connection between the component pin and the electrical pads 18 of the aperture.

As a result of the discussion of FIGS. 3 and 4 it will now be more clearly understood why the aforementioned problem associated with plasma desmear and etching processes is highly disadvantageous either because the apertures located along the central portions of the board are inadequately etched, or on the other hand, the edge of the board has been scorched or otherwise damaged by the plasma process in order to provide adequate etching of the centrally located apertures.

The present invention overcomes this problem by rendering the plasma effect virtually consistent and homogeneous throughout the surface area of the printed circuit board irrespective of the location of the aperture relative to the edge of the board. It will be seen hereinafter that the invention is relatively simple in structure but profound in its effects in curing the aforementioned disadvantages of the prior art. More specifically, as a result of the present invention rendering the plasma process far more uniform and homogeneous throughout the surface area of the printed circuit board, it is now possible to use the aforementioned test portions of the board in production to assess the etch-back of the apertures throughout the board surface irrespective of the location of the test tab. Furthermore, it is now possible to complete the plasma etching process in less time because it is no longer necessary to in effect, wait for the centrally located apertures to be etched adequately to meet the minimum specifications set for the board. Perhaps more importantly, it is no longer necessary to scorch or risk scorching the edge of the board or for that matter, to operate the plasma process along the high slope portion of the plasma effect curve in order to adequately etch-back centrally located apertures on the board.

Figure 7:
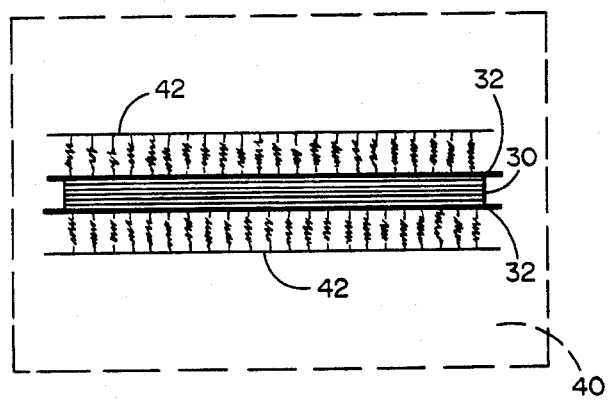
FIG. 7 is a front view of a corner of a printed circuit board utilizing the present invention with a portion of the shield cut away to show the relationship between the circuit board and the shield.
Figure 6:
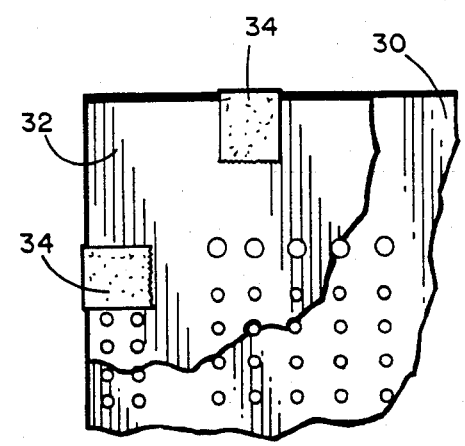
FIG. 6 is a simplified illustration of a multilayered printed circuit board with the accompanying plasma shields attached thereto shown residing within a plasma cell within a chamber during a desmear and etching process.

In the present invention the aforementioned plasma etch desmearing and etching process is modified by using at least one and preferably a pair of aluminum shields. Each of these shields has a substantially identical hole pattern and each is secured to an opposite surface of the board being subjected to plasma etching. In one particular embodiment reduced to practice, the aluminum shield is ten thousandths of an inch thick and each hole is approximately twenty thousandths larger in diameter than the corresponding hole of the circuit board. The actual relationship between the shields 32 and the board 30 within the plasma chamber may be best understood by reference to FIGS. 6 and 7. In FIG. 6 the shields 32 are shown secured to the board 30 by tape 34 which may be aluminum tape or plater's tape, both of which are well-known in the art. As seen in FIG. 7, the combination of board 30 and shields 32 is located substantially symmetrical between plasma plates 42 of a plasma cell 40 whereby plasma induced ionized discharges occur between the plasma plates 42 through the apertures within the shields and board 30.

Figure 8:
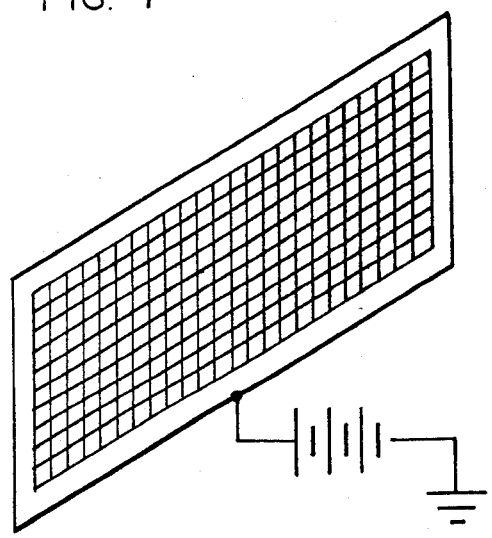
FIG. 8 is a three dimensional view, partially in a schematic form, illustrating an alternative embodiment of the present invention.

Contemplated alternative embodiments of the invention are illustrated in FIG. 8. FIG. 8 represents an alternative aluminum shield which comprises an aluminum mesh screen contained within a frame and having a substantially conventional rectangular or square mesh hole pattern substantially identical to or similar to conventional aluminum screen material used for windows and doorways. It is contemplated that one such aluminum screen configuration would replace each of the aforementioned aluminum shields 32 whereby it would not be necessary to reproduce the hole pattern of the board in such screens. An additional modification of the invention depicted in FIG. 8 comprises the use of a small DC bias illustrated schematically in FIG. 8 to render the screen somewhat analogous in function to the grid of a triode vacuum tube. It is contemplated that the bias applied to the two screens or shields affixed to the surfaces of the board would be of opposite potentials and would tend to increase the level of plasma consistency throughout the surface area of the board even further.

Figure 9:
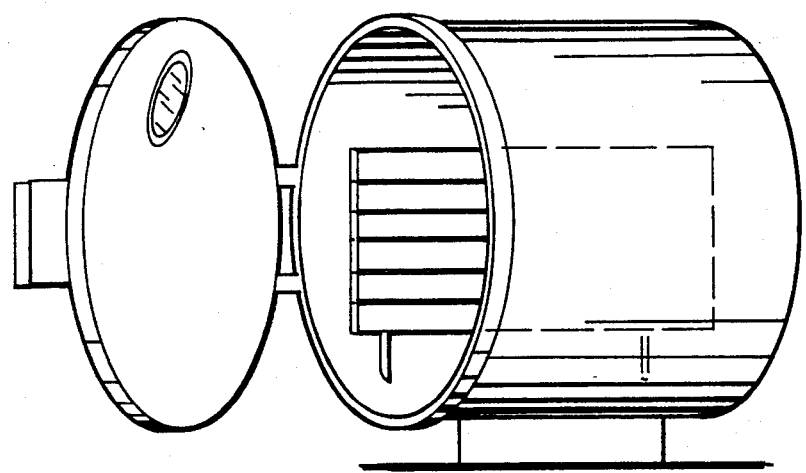
FIG. 9 is a three dimensional view of a typical plasma chamber in which the present invention may be used.
Figure 10:
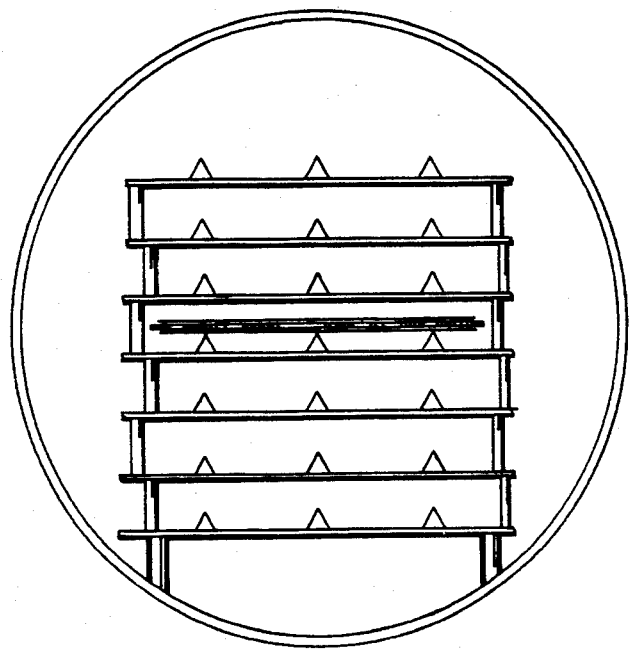
FIG. 10 is an interior view of the plasma chamber of FIG. 9 with a circuit board employing the present invention shown partially installed in one of the plasma cells.

The process in which the present invention is employed may be carried out in a conventional plasma desmear and etching apparatus that might otherwise be used without the invention. One such plasma chamber, namely, a LFE Corporation Model PSM1824 plasma desmear and etching apparatus is illustrated in part in FIGS. 9 and 10. This system uses a 13.56 MHz. RF generator with a maximum power output of 3,000 Watts, but is typically operated at a lower power such as 2.2 KiloWatts during board etch processing. FIG. 9 shows a Model 1S8 reactor portion of the LFE system with the access door open revealing a portion of the plasma cell configuration contained therein and FIG. 10 is a close-up view of the plasma cell structure shown with a printed circuit board to which aluminum shields of the present invention have been attached and with the combination being partially inserted into a selected plasma cell. Because the present invention may be utilized with a conventional plasma desmear and etching system it is not necessary to describe the plasma system herein as such systems are well-known in the art and are described in detail in the respective operating manuals of the manufacturers thereof with which those having skill in the art are already well acquainted.

It will now be understood what has been disclosed herein comprises an improved process for plasma desmear etching of printed circuit boards and a novel apparatus for carrying out the process improvement. The apparatus comprises a pair of shields preferably of aluminum which are adapted to substantially duplicate the hole pattern of a multilayered printed circuit board to which two such shields are attached, one on each plasma surface of the board. The shields have the novel, highly advantageous and surprising effect of equalizing the plasma-induced etching of apertures within the printed circuit board along the entire surface thereof, thereby overcoming or substantially reducing the aforementioned disadvantages of conventional plasma desmear and etching systems. As a result of this improvement it is now possible to desmear and etch modern exotic materials within multilayered printed circuit boards utilizing a plasma process while avoiding the disadvantages of the prior art. More specifically, it is now possible to etch-back all of the apertures of a multilayered printed circuit board by an amount which is substantially equal throughout the surface area of the board irrespective of how close each such aperture is to the edge of the board. Furthermore, it is now possible to carry out the desmear and etching process in a shorter period of time and without scorching or otherwise damaging certain portions of the board in order to be sure that the centrally located apertures are adequately etched back to provide a board which is fully functional and electrically reliable.

Those having skill in the art to which the present invention pertains will, as a result of the teaching contained herein, appreciate that certain additions and modifications of the invention may be made. By way of example, a second embodiment of the invention disclosed herein comprises an aluminum screen mesh which may be used instead of the aforementioned aluminum shield while obviating the requirement for pre-drilling the identical hole configuration into such shields prior to their use. Furthermore, it is also contemplated that additional embodiments may be provided utilizing either the screen mesh or the apertured shield whereby a small DC bias may be applied to one or both such shields or screens to further improve the process. In any case all such additions and modifications, whether or not disclosed herein, are contemplated as being within the scope of the present invention which is to be limited only by the claims appended hereto.

We claim:

1. An improved process for desmearing and etching the drilled apertures of a multilayered printed circuit board, the board of the type having a plurality of laminated layers, the process of the type that employs an evacuatable chamber having at least one pair of electrode plates for generating a plasma field therebetween; the improvement comprising the steps of:

providing a pair of metal shields, each such shield being substantially identical in configuration to said circuit board and being substantially identical in aperture pattern to said circuit board, securing said shields to opposite surfaces of said printed circuit board in substantially congruent relation thereto, subjecting said shields and circuit board to plasma desmear and etching within said plasma chamber for a selected period of time, and removing said shields from said printed circuit board upon the withdrawal of said shields and circuit board from said plasma chamber.

2. The improved process recited in claim 1 wherein said metal shields are made of aluminum.

3. The improved process recited in claim 1 wherein said metal shields are about ten thousandths of an inch in thickness.

4. The improved process recited in claim 1 wherein each said metal shield comprises apertures which are greater in dimension than the corresponding apertures of said printed circuit board.

5. The improved process recited in claim 1 further comprising the step of applying a D.C. bias voltage to at least one of said shields while said shields and circuit board are being subjected to plasma desmear and etching.

6. An improved process for desmearing and etching the drilled apertures of a multilayered printed circuit board, the board of the type having a plurality of laminated layers, the process of the type that employs an evacuatable chamber having at least one pair of electrode plates for generating a plasma field therebetween; the improvement comprising the steps of:

providing at least one metal shield having a sufficient surface area to cover virtually the entire apertured surface of said circuit board and also having an aperture pattern that is substantially identical to the aperture pattern of said circuit board, securing said shield to a surface of said printed circuit board in substantially congruent aperture relation thereto, subjecting said shield and circuit board to plasma desmear and etching within said plasma chamber for a selected period of time, and removing said shield from said printed circuit board after the withdrawal of said shield and circuit board from said plasma chamber.

7. The improved process recited in claim 6 wherein said metal shield is made of aluminum.

8. The improved process recited in claim 6 wherein said metal shield is about ten thousandths of an inch in thickness.

9. The improved process recited in claim 6 wherein said metal shield comprises apertures which are greater in dimension than the corresponding apertures of said printed circuit board.

10. The improved process recited in claim 6 further comprising the step of applying a D.C. bias voltage to said shield while said shield and circuit board are being subjected to plasma desmear and etching.

11. An apparatus for use in plasma desmear and etching of multilayered printed circuit boards of the type having a plurality of laminated layers and a pattern of apertures extending therethrough for interconnecting the pins of components to electrical circuits of the respective layers, the apparatus comprising:

a metal, planar shield having a surface configuration of sufficient dimensions to overlap virtually the entire apertured surface of a selected one of said circuit boards and also having an aperture pattern that is substantially identical to the aperture pattern of said selected circuit board, and means for temporarily securing said shield to a surface of said selected circuit board in substantially congruent aperture relation thereto.

12. The apparatus recited in claim 11 wherein said shield is made of aluminum.

13. The apparatus recited in claim 11 wherein said shield is about ten thousandths of an inch in thickness.

14. The apparatus recited in claim 11 wherein said shield comprises apertures which are greater in cross-sectional dimensions than the corresponding apertures of said selected circuit board.

15. The apparatus recited in claim 11 further comprising means for applying a selected D.C. bias voltage to said shield.

16. An apparatus for use in plasma desmear and etching of multilayered printed circuit boards of the type having a plurality of laminated layers and a pattern of apertures extending therethrough for interconnecting the pins of components to electrical circuits of the respective layers, the apparatus comprising:

a metal, planar screen having a surface configuration of sufficient dimensions to overlap virtually the entire apertured surface of a selected one of said circuit boards, and means for temporarily securing said screen to a surface of said selected circuit board.

17. The apparatus recited in claim 16 wherein said screen is made of aluminum.

18. The apparatus recited in claim 16 wherein said screen is about twenty five thousandths of an inch in thickness.

19. The apparatus recited in claim 16 further comprising means for applying a selected D.C. bias voltage to said screen.

* * * * *